(12) United States Patent
McClure et al.

(10) Patent No.: US 9,070,654 B2
(45) Date of Patent: Jun. 30, 2015

(54) SMOOTHING METHOD FOR SEMICONDUCTOR MATERIAL AND WAFERS PRODUCED BY SAME

(71) Applicant: Cree, Inc., Durham, NC (US)

(72) Inventors: Davis Andrew McClure, Raleigh, NC (US); Nathaniel Mark Williams, Raleigh, NC (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 13/868,731

(22) Filed: Apr. 23, 2013

(65) Prior Publication Data

US 2013/0234162 A1 Sep. 12, 2013

Related U.S. Application Data

(62) Division of application No. 12/788,592, filed on May 27, 2010, now Pat. No. 8,445,386.

(51) Int. Cl.
*H01L 29/34* (2006.01)
*H01L 29/66* (2006.01)
(Continued)

(52) U.S. Cl.
CPC .......... *H01L 29/34* (2013.01); *H01L 29/66053* (2013.01); *C30B 29/36* (2013.01); *C30B 33/00* (2013.01); *C30B 33/005* (2013.01); *H01L 21/02024* (2013.01); *H01L 21/02378* (2013.01);
(Continued)

(58) Field of Classification Search
CPC ............ H01L 21/02008; H01L 21/02019; H01L 21/0209; H01L 21/02233; H01L 21/02378; H01L 29/66053; H01L 21/02387

USPC ............................................. 257/77, E21.054
See application file for complete search history.

(56) References Cited

U.S. PATENT DOCUMENTS 5,376,224 A 12/1994 Zarowin ........................ 216/66
6,306,675 B1 * 10/2001 Tsong et al. .................... 438/47
(Continued)

FOREIGN PATENT DOCUMENTS

CN 101052754 A 10/2007
EP 2394787 A1 12/2011
(Continued)

OTHER PUBLICATIONS

Powell et al, "Sources of Morphological Defects in SiC Epilayers," 1996, Transaction Third International High-Temperature Electronics Conference, vol. 1, pp. II-3-II-8.*
(Continued)

*Primary Examiner* — Joseph C Nicely
(74) *Attorney, Agent, or Firm* — Steven B. Phillips; Moore & Van Allen PLLC

(57) ABSTRACT

A smoothing method for semiconductor material and semiconductor wafers produced by the method are disclosed. Semiconductor wafers with reduced atomic steps, as well with reduced scratches and subsurface defects can be produced. Such wafers feature an improved growth surface that can provide for the growth of an epilayer with reduced macroscopic defects and defect densities. A method of smoothing the surface of a wafer according to example embodiments of the invention includes planarizing the surface of a semiconductor wafer, and then oxidizing the wafer to achieve a specified thickness of oxide on the surface of the wafer. The oxide can then be stripped from the surface of the semiconductor wafer.

13 Claims, 2 Drawing Sheets

(51) Int. Cl.
*C30B 29/36* (2006.01)
*C30B 33/00* (2006.01)
*H01L 21/02* (2006.01)
*H01L 21/04* (2006.01)
*H01L 21/306* (2006.01)
*H01L 29/16* (2006.01)

(52) U.S. Cl.
CPC ....... *H01L 21/0243* (2013.01); *H01L 21/02529* (2013.01); *H01L 21/02538* (2013.01); *H01L 21/02658* (2013.01); *H01L 21/0445* (2013.01); *H01L 21/30604* (2013.01); *H01L 29/1608* (2013.01)

(56) References Cited

U.S. PATENT DOCUMENTS

| | | | | |
|---|---|---|---|---|
| 6,377,596 | B1* | 4/2002 | Tanaka et al. | 372/45.01 |
| 6,488,771 | B1* | 12/2002 | Powell et al. | 117/89 |
| 6,821,309 | B2 | 11/2004 | Singh et al. | |
| 6,866,793 | B2 | 3/2005 | Signh | |
| 6,939,756 | B1 | 9/2005 | Chung et al. | 438/198 |
| 7,148,189 | B2 | 12/2006 | Singh | |
| 8,035,112 | B1 | 10/2011 | Cooper et al. | 257/77 |
| 2001/0015170 | A1* | 8/2001 | Kitabatake | 117/95 |
| 2002/0014640 | A1 | 2/2002 | Mitlehner et al. | 257/256 |
| 2002/0173252 | A1 | 11/2002 | Li | 451/259 |
| 2003/0012050 | A1 | 1/2003 | Iwasaki | 365/171 |
| 2003/0077995 | A1 | 4/2003 | Li et al. | 451/528 |
| 2003/0162399 | A1 | 8/2003 | Singh | |
| 2003/0168627 | A1 | 9/2003 | Singh et al. | |
| 2006/0102068 | A1* | 5/2006 | Tsvetkov et al. | 117/89 |
| 2007/0051301 | A1* | 3/2007 | Hirooka | 117/89 |
| 2007/0290211 | A1* | 12/2007 | Nakayama et al. | 257/77 |
| 2008/0032880 | A1* | 2/2008 | Maruyama et al. | 501/88 |
| 2008/0050844 | A1* | 2/2008 | Masuda | 438/4 |
| 2008/0054412 | A1* | 3/2008 | O'Loughlin et al. | 257/627 |
| 2008/0067524 | A1* | 3/2008 | Basceri et al. | 257/77 |
| 2008/0113460 | A1* | 5/2008 | Shelton et al. | 438/28 |
| 2008/0169476 | A1* | 7/2008 | Powell et al. | 257/77 |
| 2008/0237190 | A1 | 10/2008 | Aoki et al. | 216/99 |
| 2008/0251798 | A1* | 10/2008 | Ogihara et al. | 257/88 |
| 2009/0173958 | A1* | 7/2009 | Chakraborty et al. | 257/98 |
| 2009/0230406 | A1* | 9/2009 | Ellison et al. | 257/77 |
| 2009/0302326 | A1* | 12/2009 | Maruyama | 257/77 |
| 2010/0065988 | A1* | 3/2010 | Hannon et al. | 264/500 |
| 2010/0213516 | A1 | 8/2010 | Ohmi et al. | 257/255 |
| 2010/0221917 | A1 | 9/2010 | Masuda | 438/692 |
| 2010/0258528 | A1 | 10/2010 | Singh et al. | 216/53 |
| 2011/0031502 | A1* | 2/2011 | Bergmann et al. | 257/77 |
| 2011/0079813 | A1* | 4/2011 | Yeol et al. | 257/98 |
| 2011/0156058 | A1* | 6/2011 | Hori et al. | 257/77 |

FOREIGN PATENT DOCUMENTS

| | | | | |
|---|---|---|---|---|
| JP | 11111674 | A | 4/1999 | ............ H01L 21/306 |
| JP | 2005064392 | A | 3/2005 | |
| WO | WO 2007086196 | A1 | 8/2007 | .............. H01L 29/12 |
| WO | 2010090024 | A1 | 8/2010 | |

OTHER PUBLICATIONS

Christian Hollauer, "Oxidation Parameters," http://www.iue.tuwien.ac.at/phd/hollauer/node14.html, Dec. 6, 2007.

Raynaud, Christophe, "Silica films on silicon carbide: a review of electrical properties and device applications", Journal of Non-Crystalline Solids, 280, 2001, pp. 1-31.

Cree Inc., International Application No. PCT/US2011/037695, International Search Report and Written Opinion, Sep. 2, 2011.

Fenner, D.B., et al., Ion-Beam Nano-Smoothing of Sapphire and Silicon Carbide Surfaces, Proceedings of SPIE, 2001, pp. 17-24, vol. 4468.

Tanaka, S., et al., Initial stage of aluminum nitride film growth on 6H-silicon carbide by plasma-assisted, gas-source molecular beam epitaxy, Applied Physics Letters, Jan. 2, 1995, pp. 37-39, vol. 66, No. 1.

Saddow, S.E., et al., Effects of Substrate Surface Preparation on Chemical Vapor Deposition Growth of 4H-SiC Epitaxial Layers, Journal of Electronic Materials, 2001, pp. 228-234, vol. 30, No. 3.

Kawasuso, A., et al., Effect of hydrogen etching on 6H SiC surface morphology studied by reflection high-energy positron diffraction and atomic force miscroscopy, Applied Physics Letters, Feb. 28, 2000, pp. 1119-1121, vol. 76, No. 9.

Kitano, T., et al., Silicon Surface Imperfection Probed with a Novel X-Ray Diffraction Technique and Its Influence on the Reliability of Thermally Grown Silicon Oxide, Jpn. J. Appl. Phys., 1993, pp. L1581-L1583, vol. 32, part 2, No. 11A.

Monnoye, S., et al., Surface Preparation Techniques for SiC Wafers, Silicon Carbide: Recent Major Advances, 2004, pp. 699-710.

Cree, Inc., Chinese Application No. 201180034253.5, First Office Action, Nov. 2, 2014.

Cree, Inc., Japanese Application No. 2013-512144, Decision of Rejection, Sep. 2, 2014.

Cree, Inc., German Application No. 112011101813.4, Office Action, Sep. 8, 2014.

* cited by examiner

SMOOTHING METHOD FOR SEMICONDUCTOR MATERIAL AND WAFERS PRODUCED BY SAME

CROSS REFERENCE TO RELATED APPLICATION

This application is a divisional application of and claims priority from U.S. application Ser. No. 12/788,592, filed May 27, 2010, the entire disclosure of which is hereby incorporated by reference.

BACKGROUND

Semiconductor devices are typically fabricated on a substrate that provides mechanical support for the device and often contributes to the electrical performance of the device as well. Silicon, germanium, gallium arsenide, sapphire and silicon carbide are some of the materials commonly used as substrates for semiconductor devices. Many other materials are also used as substrates. Semiconductor device manufacturing typically involves fabrication of many semiconductor devices on a single substrate.

Substrates are often formed in the shape of circular wafers having a diameter presently ranging, for example, from less than 1 inch (2.54 cm) to over 12 inches (30.5 cm) depending on the type of material involved. Other shapes such as for example square, rectangular or triangular wafers exist. Semiconductor devices are formed on the wafers by the precise formation of thin layers of semiconductor, insulator and metal materials which are deposited and patterned to form useful semiconductor devices such as diodes, transistors, solar cells and other devices.

Semiconductor crystals can be produced by a number of techniques. For example, in a typical silicon carbide crystal growth technique, a seed crystal and a source material are both placed in a reaction crucible which is heated to the sublimation temperature of the source and in a manner that produces a thermal gradient between the source and the marginally cooler seed crystal. The thermal gradient encourages vapor phase movement of the materials from the source to the seed followed by condensation upon the seed and the resulting bulk crystal growth. The method is also referred to as physical vapor transport.

A bulk single crystal of semiconductor material may then be desirably cut into wafers and polished prior to the growth of epitaxial layers and the formation of devices on the wafers as described above. Mechanical polishing can leave defects, such as scratches in a wafer, which in turn may cause defects in the epitaxial layers. Defects from mechanical polishing can be reduced with additional treatment, for example a reactive ion etch (RIE).

SUMMARY

Embodiments of the present invention provide semiconductor wafers with reduced atomic steps, as well as with reduced scratches and/or subsurface defects introduced by mechanical polishing. A wafer according to at least some embodiments of the invention is smoothed in order to have an improved growth surface. This improved growth surface can provide for the growth of an epilayer with reduced macroscopic defects and reduced overall defect density as compared to a wafer where the growth surface has been prepared by mechanical polishing and/or mechanical polishing followed by RIE and/or mechanical polishing followed by chemical mechanical planarization.

A semiconductor wafer according to example embodiments of the invention can be substantially free of scratches and can have an overall subsurface defect density that is numerically no greater than the defect density in the bulk crystal from which the semiconductor wafer was cut or the center of the semiconductor wafer. A semiconductor wafer according to some embodiments may have an arithmetic mean surface roughness of less than 0.2 nm over a 1×1 micron or greater area. A wafer according to an embodiment of the invention can also be substantially free of atomic steps in the surface of the wafer as compared to a surface subject to chemical mechanical planarization. In some embodiments, the appearance of atomic steps is reduced by at least 50% compared to the appearance immediately after planarization. In some embodiments, the appearance of atomic steps is reduced by at least 75% compared to the appearance immediately after planarization.

In some embodiments, the semiconductor wafer can be made of silicon carbide. In some embodiments, the semiconductor wafer can have an arithmetic mean surface roughness of less than 0.1 nm over a 1×1 micron or greater area. In some embodiments, the semiconductor wafer can have a surface that is substantially random compared to a surface resulting from chemical mechanical planarization, meaning that atomic steps and/or scratches and/or subsurface defects are completely or nearly eliminated.

In some embodiments of the invention, the improved growth surface of the semiconductor wafer can provide for the growth of an epilayer that is substantially free of macroscopic defects. The growth of such an epilayer is possible because the reduction of atomic steps in the wafer is accompanied by a reduction in structural defects in the wafer that can otherwise cause macroscopic defects in the epilayer. Semiconductor die and devices made from such a wafer with an epilayer will likewise be substantially free of macroscopic defects in the epilayer. The epilayer can consist of or include silicon carbide or group III-V compounds. The epilayer can also have an overall defect density that is less than $1\times10^8$ $cm^{-2}$. In some embodiments, the epilayer can have an overall defect density that is less than $5\times10^7$ $cm^{-2}$.

In example embodiments of the invention, a method of smoothing the surface of a semiconductor wafer includes planarizing the semiconductor wafer, and then oxidizing the wafer to achieve a specified thickness of oxide on the surface of the wafer. The oxide can then be stripped from the surface of the semiconductor wafer, leaving a smoothed surface. In some embodiments, the wafer is thermally oxidized at a temperature of between 1225 C and 1800 C for a time sufficient to achieve the specified thickness of oxide. In some embodiments, the specified thickness of the oxide is at least 500 angstroms. In some embodiments, the planarizing of the wafer is accomplished through chemical mechanical planarization (CMP).

BRIEF DESCRIPTION OF THE DRAWINGS

FIG. 1 illustrates the wafer at various stages of the process in FIGS. 1A, 1B, 1C and 1D.

DETAILED DESCRIPTION

Figure 1A:
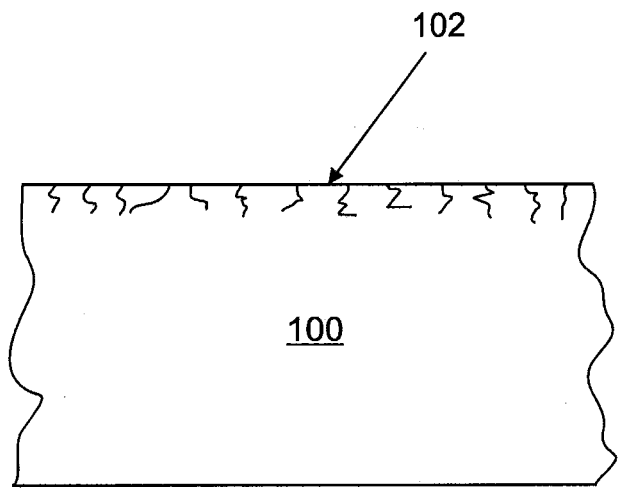
FIG. 1 shows schematic drawings of a semiconductor wafer in a cutaway, side view.

The following detailed description refers to the accompanying drawings, which illustrate specific embodiments of the invention. Other embodiments having different structures and operation do not depart from the scope of the present invention.

Embodiments of the invention are described with reference to drawings included herewith. It should be noted that the drawings are schematic in nature. The thicknesses of layers are not drawn to scale, but rather are shown as most convenient for illustration.

Embodiments of the present invention provide for semiconductor wafers with reduced defects and reduced atomic steps in the wafer surface. Thus, a wafer according to at least some embodiments of the invention has an improved growth surface. This improved growth surface can provide for the growth of an epilayer with reduced macroscopic defects, as compared to a substrate where the growth surface has been prepared by mechanical material removal followed by reactive ion etch and/or mechanical material removal followed by chemical mechanical planarization. The term "mechanical material removal" refers to processes including polishing, grinding, lapping and any other similar techniques.

FIG. 1 illustrates a portion of a semiconductor wafer 100 as viewed from the side. Wafer 100 has been cut from a semiconductor crystal and subjected to mechanical material removal, producing the wafer shown in FIG. 1A. The material removal process leaves behind damage at surface 102, which in FIG. 1A is indicated by lines representing subsurface defects and scratches. Subsurface defects are irregularities in the crystal structure that lie just below the surface of the wafer. These subsurface defects can range in density up to $10^{12}$ per cubic centimeter. The subsurface defects can range in depth from immediately below the wafer surface to 5 microns below the surface of the wafer. A scratch is a mark left on the surface by mechanical material removal. These marks can be macroscopic, that is visible to the naked eye, or microscopic in size. Microscopic scratches can typically be seen by atomic force microscopy of an area approximately 1×1 micron or smaller in size. As a specific example, mechanical material removal for silicon carbide wafers is often accomplished using diamond removal media, and diamond particles can leave scratches in the surface of the wafer.

In accordance with an embodiment of the present invention, chemical mechanical planarization (CMP) is then applied to wafer 100 of FIG. 1. CMP might also be referred to as "chemical mechanical polishing," however for purposes of this disclosure the term chemical mechanical planarization will be used to distinguish the CMP process from any initial mechanical material removal, which may including polishing of the wafer, which leaves behind the scratches and subsurface defects referred to above. CMP is one example of a technique for planarizing the wafer, or making the wafer surface smooth enough for growing epilayers with low enough defect densities to produce working devices.

Figure 1B:
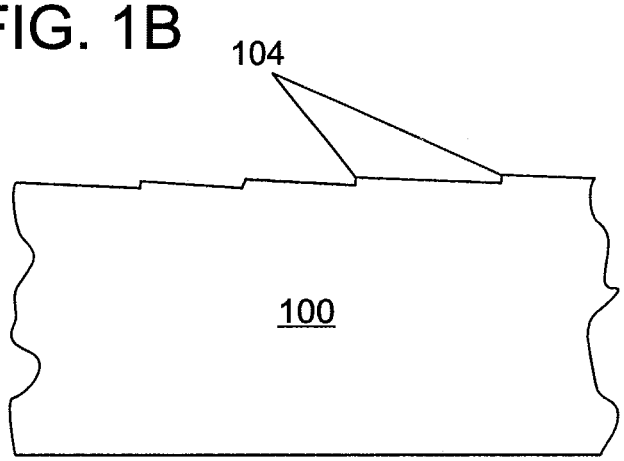

A CMP process combines mechanical polishing with a chemical slurry to produce a much smoother wafer surface than would be possible with mechanical material removal alone. Chemical mechanical planarization (polishing) equipment and chemicals are available to the semiconductor industry from various vendors, for example, Cabot Microelectronics Corp. of Aurora, Ill., USA, Nalco of India, and Rohm and Haas Advanced Materials of Philadelphia, Pa., USA. A CMP process, while reducing scratches and subsurface defects introduced by mechanical material removal, can leave behind structural defects. A structural defect is a localized, structural change in the wafer surface over a distance of about 10 to 5000 microns. The CMP process can also leave atomic steps 104 in the surface of wafer 100 as shown in FIG. 1B. The step-like structure remaining after the CMP process is caused by the planes of the crystal lattice. The spacing and direction of these atomic steps depend on the orientation of the wafer relative to the crystal lattice. For nominally on-axis wafers the spacing and direction of these steps can vary locally.

When an epilayer is grown on a wafer after CMP is applied to the wafer, the epilayer may have macroscopic defects resulting from the structural defects. Macroscopic defects are defects from about 10 to 5000 microns in size characterized by localized, morphological changes in the epilayer. Upon inspection, these defects can appear as voids in the epilayer.

Figure 1C:
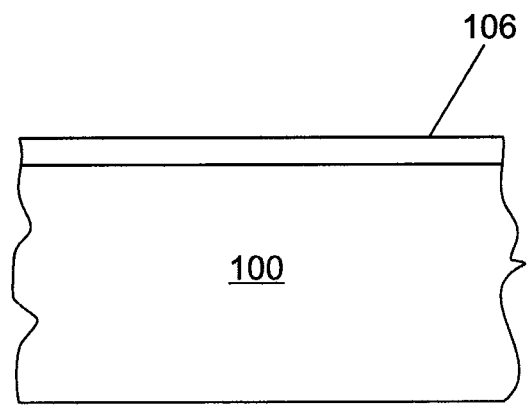

In further accordance with an embodiment of the invention, subsequent to the CMP process described above, an oxide 106 is formed on the surface of the wafer as shown in FIG. 1C. Oxide 106 is pictured on the top surface of the wafer, but an oxide may form on the bottom surface or edges as well. In example embodiments, dry, thermal oxidation is used to form an oxide layer on the silicon carbide wafer. In some embodiments, the wafer is held at a temperature from about 1225 degrees C. to about 1800 degrees C. In some embodiments, the wafer is held at a temperature of about 1300 degrees C. The wafer can be placed in a tube furnace that has been filled with oxygen. With such a process applied to a silicon carbide wafer, silicon dioxide ($SiO_2$) forms on the surface of the wafer and carbon dioxide gas is given off. The silicon atoms in the $SiO_2$ and the carbon atoms in the carbon dioxide come from the silicon carbide in the wafer.

Still referring to FIG. 1C, the silicon dioxide 106 grows to a specified thickness which is proportional to the amount of time the wafer is heated. At other temperatures, for example 1500 degrees C., time can be adjusted to produce an oxide of a given thickness. Trial and error with sacrificial wafers accompanied by inspection and measurement can be used to adjust the time and temperature to achieve the desired thickness of oxide. It is also possible and may be desirable to measure the oxide in order to achieve the desired thickness during production. With silicon carbide wafers, an oxide thickness of about 500 angstroms or greater has been found to achieve good results with respect to the reduction of atomic steps and structural defects in the surface of the wafer. For some purposes, other thicknesses of oxide may be sufficient or desirable, such as 200, 300, 400 or 1000 angstroms. It has been found that, for a typical silicon carbide wafer, holding the wafer at a temperature of about 1300 degrees C. for about 45 minutes in an oxygen-filled tube furnace will produce an oxide of greater than or equal to about 500 angstroms.

Figure 1D:
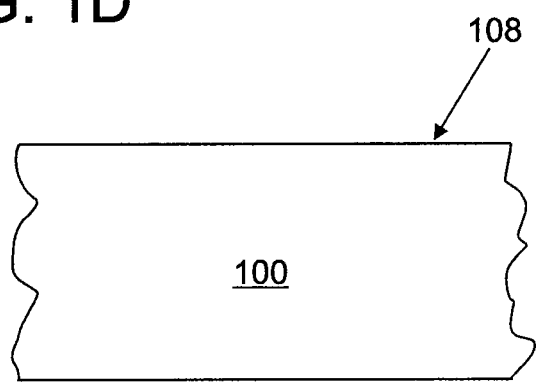

Turning to FIG. 1D, the oxide is stripped from the wafer to leave surface 108 of wafer 100, in which atomic steps, structural defects and subsurface defects are substantially reduced. Various techniques can be used to strip the oxide from the semiconductor wafer. With a silicon carbide wafer, a buffered oxide etch process using hydrofluoric acid can be carried out. Once the wafer with an improved surface has been produced by this process, the wafer can be used as a substrate for electronic devices. The reduction of atomic steps is accompanied by a reduction in structural defects that can cause macroscopic defects in the epilayer. An epilayer substantially free of macroscopic defects can be grown on the substrate. The substrate can be further cut into die to make electronic devices with relatively few defects within portions of devices that reside within the epilayer.

In a wafer according to embodiments of the invention, the appearance of atomic steps can be significantly reduced. The appearance of atomic steps is reduced as the oxide thickness increases, until atomic steps cannot be readily observed. In some embodiments, the appearance of atomic steps can be reduced by 50% compared to the appearance of atomic steps immediately after planarization. In some embodiments, the surface of the semiconductor wafer or die can have an arithmetic mean surface roughness of less than 0.2 nm over a 1×1 micron or greater area. The surface roughness can provide a numerical indication of the presence of scratches. In some embodiments, the wafer can exhibit a subsurface defect density that is numerically no greater than the defect density in the bulk crystal from which the semiconductor wafer was cut, or the center of the semiconductor wafer.

In some embodiments, the appearance of atomic steps can be reduced by at least 75% compared to the appearance after chemical mechanical planarization. In some embodiments, the surface can have an arithmetic mean surface roughness of less than 0.1 nm over a 1×1 micron or greater area. In some embodiments, the semiconductor wafer can have a surface that is substantially random compared to a surface resulting from mechanical material removal followed by chemical mechanical planarization, meaning that atomic steps, scratches and subsurface defects are completely or nearly eliminated. The surface of the wafer can also be said to be substantially free of scratches, subsurface defects, or steps, as the case may be. To be substantially free of any of these characteristics means that the relative characteristic cannot be visually observed with standard tools for semiconductor inspection and characterization, which could include various forms of microscopy.

In some embodiments of the invention, the improved growth surface of the semiconductor wafer can provide for the growth of an epilayer that is substantially free of macroscopic defects. This epilayer results because the reduction in atomic steps is accompanied by a corresponding reduction in structural defects that may have been present after planarization. A wafer with an epilayer that is substantially free of macroscopic defects can be cut into die and used to make electronic devices. The epilayer portion of these devices will also be substantially free of macroscopic defects. The epilayer grown on wafers according to some embodiments of the invention may also have a reduced number of overall defects, such that the epilayer exhibits a defect density of no more than $1 \times 10^8$ cm$^2$. In some embodiments the epilayer exhibits a defect density of no more than $5 \times 10^7$ cm$^{-2}$. In some example embodiments, the epilayer can be composed of group III-V compounds. Examples of group III-V compounds include gallium nitride (GaN) and gallium arsenide (GaAs).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Additionally, comparative, quantitative terms such as "less" and "greater", are intended to encompass the concept of equality, thus, "less" can mean not only "less" in the strictest mathematical sense, but also, "less than or equal to."

It should also be pointed out that references may be made throughout this disclosure to figures and descriptions using terms such as "top", "bottom", "within", "on", and other terms which imply a relative position of a structure or portion. These terms are used merely for convenience and refer only to the relative position of features as shown from the perspective of the reader. An element that is placed or disposed atop another element in the context of this disclosure can be functionally in the same place in an actual product but be beside or below the other element relative to an observer due to the orientation of a device or equipment. Any discussions which use these terms are meant to encompass various possibilities for orientation and placement.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

The invention claimed is:

1. A wafer comprising:
a substrate with a surface wherein an appearance of atomic steps is reduced by at least 50% compared to the surface after chemical mechanical planarization and an arithmetic mean surface roughness less than 0.2 nm over a 1×1 micron or greater area of the surface; and
an epitaxial layer on the substrate, wherein the epitaxial layer is free of defects from 10 to 5000 microns in size that are characterized by localized morphological changes, and has a defect density of less than $5 \times 10^7$ cm$^{-2}$.

2. The wafer of claim 1 wherein the substrate further comprises silicon carbide.

3. The wafer of claim 2 wherein the epitaxial layer further comprises silicon carbide or a group III-V compound.

4. The wafer of claim 3 wherein the surface is free of scratches and atomic steps.

5. A die cut from the silicon carbide wafer of claim 3.

6. A device made from the die of claim 5.

7. A semiconductor wafer comprising a substrate with a surface wherein an appearance of atomic steps is reduced by at least 50% compared to the surface after mechanical material removal and chemical mechanical planarization, the surface also having an arithmetic mean surface roughness less than 0.2 nm over a 1×1 micron or greater area and the semiconductor wafer also having an epitaxial layer with a defect density of less than $5 \times 10^7$ cm$^{-2}$, and being prepared by a process comprising:
planarizing a surface of the semiconductor wafer;
oxidizing the semiconductor wafer; and
growing the epitaxial layer on the substrate so as to be free of defects from 10 to 5000 microns in size that are characterized by localized morphological changes.

8. The semiconductor wafer of claim 7 wherein the planarizing of the surface of the wafer further comprises chemical mechanical planarization.

9. The semiconductor wafer of claim 8 wherein the process further comprises stripping from the semiconductor wafer an oxide formed by the oxidizing of the semiconductor wafer.

10. The semiconductor wafer of claim 9 wherein the semiconductor wafer further comprises silicon carbide.

11. The semiconductor wafer of claim 10 wherein the oxidizing of the semiconductor wafer further comprises thermally oxidizing the wafer at a temperature of between 1225 C and 1800 C for a time sufficient to achieve a specified thickness of oxide.

12. The semiconductor wafer of claim 11 wherein the oxidizing is accomplished by dry oxidation and the specified thickness of oxide is at least 500 angstroms.

13. The semiconductor wafer of claim 12 wherein the epitaxial layer further comprises at least one of silicon carbide and a group III-V compound.

* * * * *